United States Patent [19]
Nishizawa

[11] Patent Number: 5,383,082
[45] Date of Patent: Jan. 17, 1995

[54] OVERCURRENT PROTECTOR FOR POWER ELEMENT

[75] Inventor: Yuji Nishizawa, Aichi, Japan

[73] Assignee: Mitsubishi Denki Kabushiki Kaisha, Tokyo, Japan

[21] Appl. No.: 883,381

[22] Filed: May 15, 1992

[30] Foreign Application Priority Data

May 15, 1991 [JP] Japan .................................. 3-110260

[51] Int. Cl.6 .......................................... H03K 17/08
[52] U.S. Cl. ........................................ 361/93; 361/18; 361/98
[58] Field of Search ......................... 361/93, 98, 18, 91

[56] References Cited

U.S. PATENT DOCUMENTS 4,949,213  8/1990  Sasagawa ............................. 361/91
5,200,878  4/1993  Sasagawa ............................. 361/93
5,210,479  5/1993  Kimura ................................ 361/93

Primary Examiner—Marc S. Hoff
Assistant Examiner—S. Jackson
Attorney, Agent, or Firm—Sughrue, Mion, Zinn, Macpeak & Seas; Richard C. Turner, Raymond N.J. Powell

[57] ABSTRACT

A circuit for providing an overcurrent protection for a power element, such as an IGBT, MOSFET or bipolar transistor, which is inserted between the power supply and a load, the protection circuit comprising a control circuit that provides an input to a gate amplifier at the power element gate. The gate amplifier comprises a photodiode that is connected between the amplifier power supply and the power element gate. The photodiode provides a clamp of the gate voltage in the event of an overcurrent and communicates optically with a phototransistor to provide a detection signal that can modify the control circuit operation. Specifically, the detection circuit can modify the input to the control circuit or control the output of the control circuit so that the energization of the power element is stopped or limited. The control can be through Darlington-connected transistors at the output of the phototransistor.

17 Claims, 4 Drawing Sheets

FIG. 8A  SW — ON
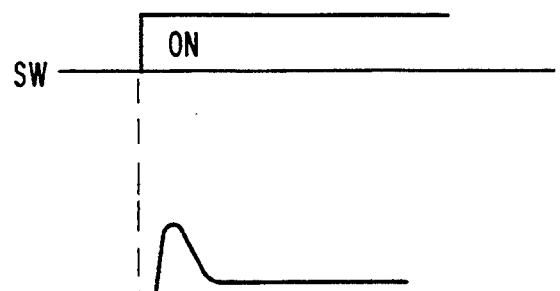
FIG. 8B  Ic 0
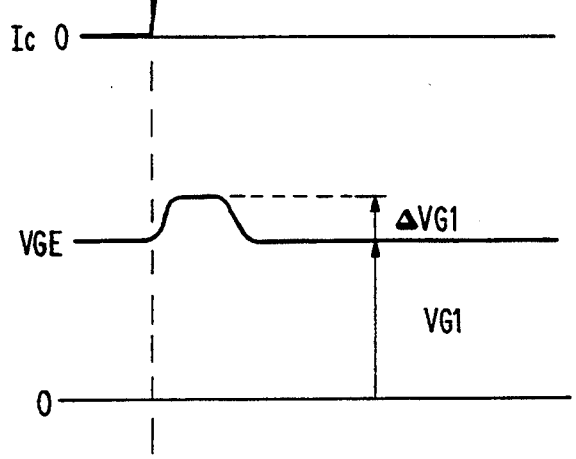
FIG. 8C  VGE — ΔVG1  VG1
0

5,383,082

1

OVERCURRENT PROTECTOR FOR POWER ELEMENT

BACKGROUND OF THE INVENTION

1. Field of the Invention

The present invention relates to an overcurrent protector for a power element which is operative to protect the power element, such as an IGBT, a power MOSFET or a bipolar transistor, against an overcurrent.

2. Description of the Background Art

FIG. 6 is a circuit diagram showing a conventional overcurrent protector for protecting a power element, inserted in a load circuit of an inverter or the like that is designed to carry out the velocity control of an induction motor, against an overcurrent or a short circuit.

Referring to FIG. 6, an IGBT or similar component 1 is used as a power element. A gate amplifier 2 is employed as control signal amplifier for driving the power element 1. A control circuit 3 is operative for outputting a control signal to the gate amplifier 2. A shunt resistor 4 is connected in series with the power element 1 for detecting an overcurrent, and an isolating circuit 5 is used for isolating and transmitting the potential difference of the shunt resistor 4 to the control circuit 3.

Generally, the main circuit for the power element 1 is electrically isolated from the control circuit 3 by the gate amplifier 2. To provide overcurrent protection for the load circuit, i.e. the main circuit, a main current Ic of the power element 1 is detected by the shunt resistor 4. The detected Ic current value is provided via the electrically isolating circuit 5, such as an insulation amplifier, as a detection signal to the control circuit 3. As a result, the power element 1 is shut off when the detection signal reaches a predetermined level.

FIG. 7 is an equivalent circuit existing at a time when an overcurrent, particularly a short circuit, occurs in the main circuit including the power element 1 shown in FIG. 6. FIGS. 8A–8C illustrate the operation of the circuit shown in FIG. 7. Referring to FIG. 7, a main circuit power supply 6 is connected in parallel with a power element 1, which has a parasitic capacity 7 on its collector and gate. A switch 8 is also shown in the circuit, for representing a short circuit on an equivalent basis.

In the circuit shown in FIG. 7, when the switch 8 is open, the voltage $V_{CE}$ between the collector and emitter of the power element 1 is 0V. If, in this state, a short circuit occurs, i.e. the switch 8 is closed, as shown in FIG. 8A, a large current Ic begins to flow in power element 1, as seen in FIG. 8B. Also, a step voltage which is developed from the DC voltage $V_{DE}$ of the main circuit power supply 6, is impressed across the collector and emitter of the power element 1. The current is seen to rise sharply, peak and then drop to a stable level, this response probably being due to circuit line inductance.

The parasitic capacity 7 existing in the power element 1 causes a voltage $V_{GE}$ between the gate and emitter of the power element 1 to rise $\Delta V_{GE}$ from a standard voltage $V_{G1}$, as shown in FIG. 8C. As a result, $V_{GE}$ exceeds the voltage of the driving DC power supply in the gate amplifier 2, further increasing the collector current Ic.

FIG. 9 is a detailed drawing of the circuit of the gate amplifier 2, acting as the control signal amplifier shown in FIG. 7. In FIG. 9, a gate driving DC power supply 9 is connected in a circuit with a photocoupler 10, comprising an LED 10A and a phototransistor 10B for

2 isolating and receiving a control signal from the control circuit 3. Also included in the circuit are resistors 11, 13 and 16, and transistors 12, 14 and 15. A diode 17 is inserted between the gate G of the power element 1 and the positive terminal of the gate driving DC power supply 9.

In order to suppress the rise of the gate voltage $V_{GE}$ of the power element 1 when an overcurrent flows in the power element 1, the diode 17 is connected in the conventional design between the gate terminal G of the power element 1 and the positive terminal of the gate driving power supply 9 in the gate amplifier 2 (positive terminal of $V_G$), as shown in FIG. 9. The diode 17 is for clamping the gate voltage $V_{GE}$ of the power element 1 to $V_{G1}$, thereby limiting the peak value of current Ic to a reduced value at the time of a short-circuit accident. For example, if $V_G$, is 15 volts, then $V_{GI}$ could be changed from a value of 15 volts to a higher value (e.g., 18 volts) and Ic could flow at a higher level when a short circuit occurs. However, the presence of the diode will limit the voltage rise, and Ic is correspondingly limited. Specifically, although the voltage will tend to get higher due to a short circuit, the diode suppresses the gain and the power is reduced. However, when the power is reduced, the peak current is suppressed and the circuit will not detect the overcurrent. As a result, the period between the start of the short circuit to the damage of the power element 1 is increased, i.e. a short-circuit capacity is improved.

However, the conventional circuit has several problems. First, because the known overcurrent protector for the power element is constructed as described above, the shunt resistor inserted into the load circuit of the conventional embodiment shown in FIG. 6 gives off a substantial quantity of heat. Second, the isolating circuit 5 provided for overcurrent detection is relatively expensive, since the increased loss may require a large-sized unit size and involve higher costs. Further, the current detector employed in the embodiment shown in FIG. 6 is required to detect a short circuit and shut off the power element. This also results in an enlarged unit size and higher costs.

SUMMARY OF THE INVENTION

It is accordingly an object of the present invention to overcome the disadvantages in the conventional design by providing an overcurrent protector for a power element which has a comparatively simple circuit structure and is effective to protect the power element from an overcurrent and a short circuit.

This object is accomplished by providing an overcurrent protection circuit for a power element which isolates the control of the power element from the detection of an overcurrent condition.

This object is accomplished by providing a single photocoupler that can achieve three operations: the clamping of the gate voltage, the isolation of the main circuit and the control circuit, and the detection of an overcurrent.

This object is accomplished in a first embodiment that provides first and second photocouplers, the second photocoupler has its input side inserted between the gate of the power element and the positive side of a gate driving DC power supply to limit the rise of the gate voltage of the power element caused by an overcurrent, and the second photocoupler can output the detection signal of the overcurrent from its output side, and the detection signal is output to the control circuit which then outputs a control signal for stopping or limiting the energization of the power element.

This object is also provided in a second embodiment, having first and second photocouplers, the second photocoupler has its input side inserted between the gate of the power element and the positive side of the gate driving DC power supply to limit the rise of the gate voltage of the power element caused by an overcurrent, and can output the detection signal of the overcurrent from its output side, and the output side of the second photocoupler is inserted between the control circuit and the input side of the first photocoupler to control the input of the control signal from the control circuit to the first photocoupler so as to stop the energization of the power element.

This object also is provided according to the third embodiment, wherein the gate and emitter of the power element are connected at the time of overcurrent detection in the output side of the second photocoupler in the second embodiment to stop the energization of the power element.

Figure 2:
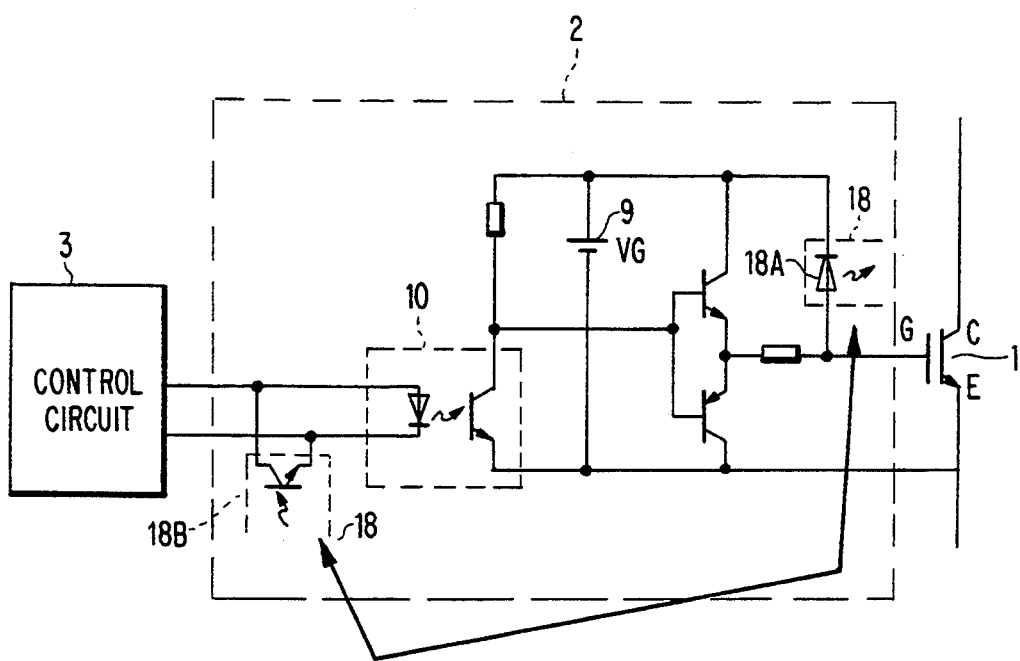
FIG. 2 is a circuit diagram of an overcurrent protector for a power element in accordance with a second embodiment of the invention.

FIG .3 illustrates an example wherein a transistor is Darlington-connected to the output side of a second photocoupler shown in FIG. 2.

Figure 4:
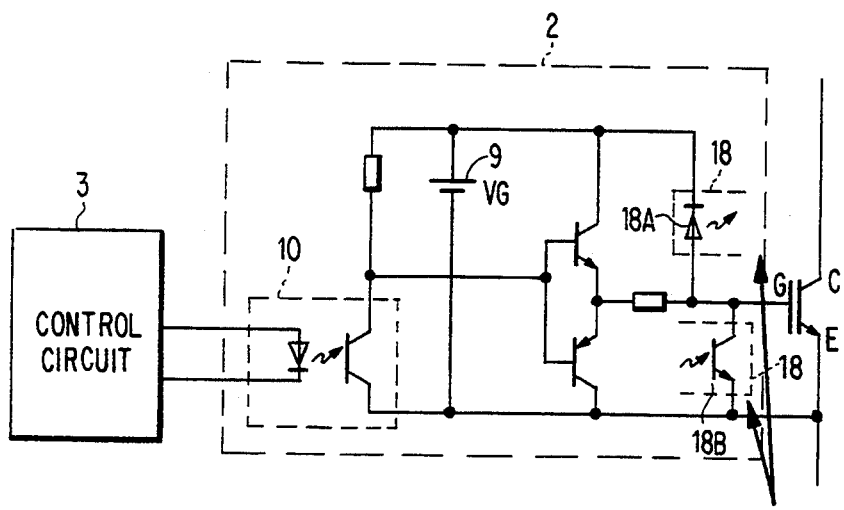

FIG. 4 is a circuit diagram of an overcurrent protector for a power element in accordance with a third embodiment of the invention.

Figure 5:
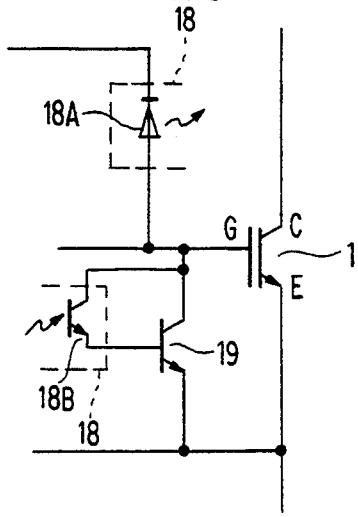

FIG. 5 illustrates an example wherein a transistor is Darlington-connected to the output side of a second photocoupler shown in FIG. 4.

Figure 6:
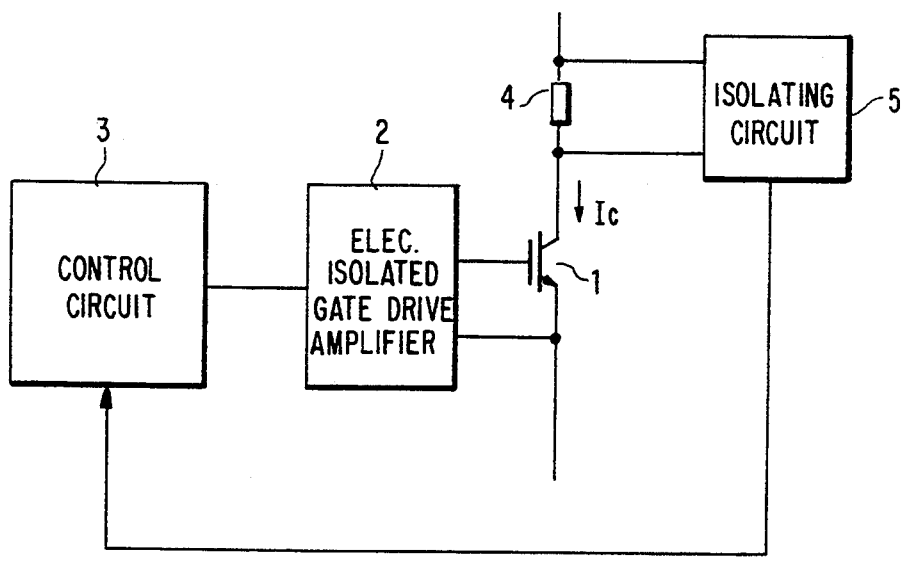

FIG. 6 is a circuit diagram of a conventional overcurrent protector for a power element known in the art.

Figure 7:
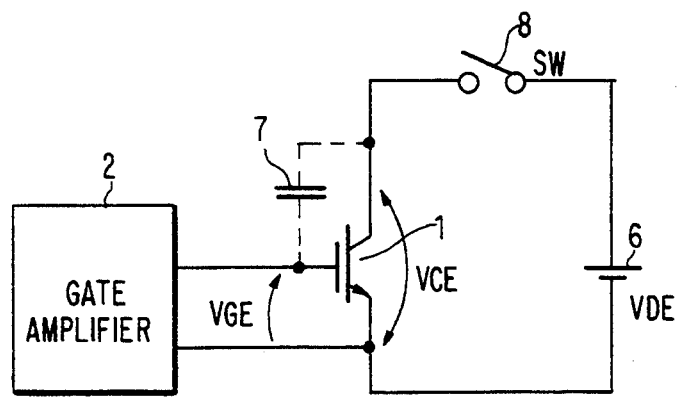

FIG. 7 is an equivalent circuit diagram for the circuit shown in FIG. 6.

FIG. 8 illustrates the operation of the equivalent circuit shown in FIG. 7.

Figure 9:
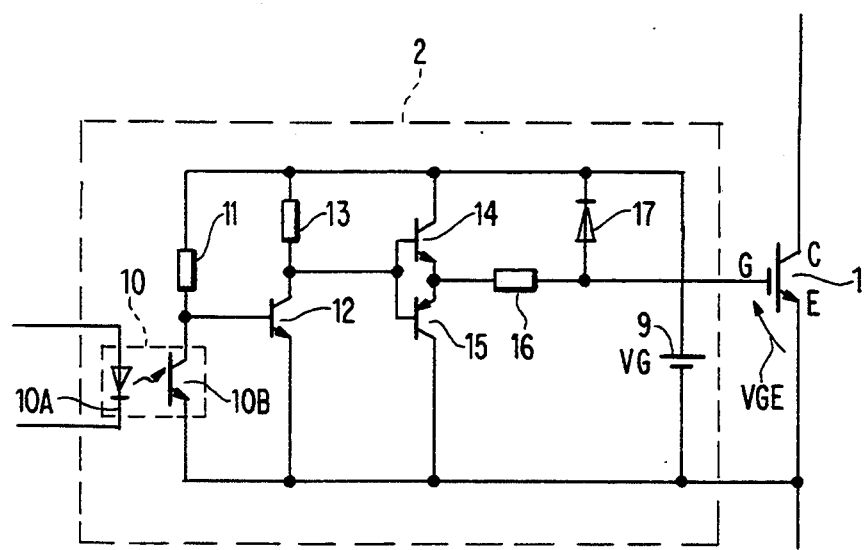

FIG. 9 is a detailed circuit diagram of a gate amplifier shown in FIG. 6.

DESCRIPTION OF THE PREFERRED EMBODIMENTS

A first embodiment of the invention will now be described in reference to FIG. 1, wherein parts designated by reference characters that are identical to those in the conventional design indicate identical or corresponding parts in that design.

Figure 1:
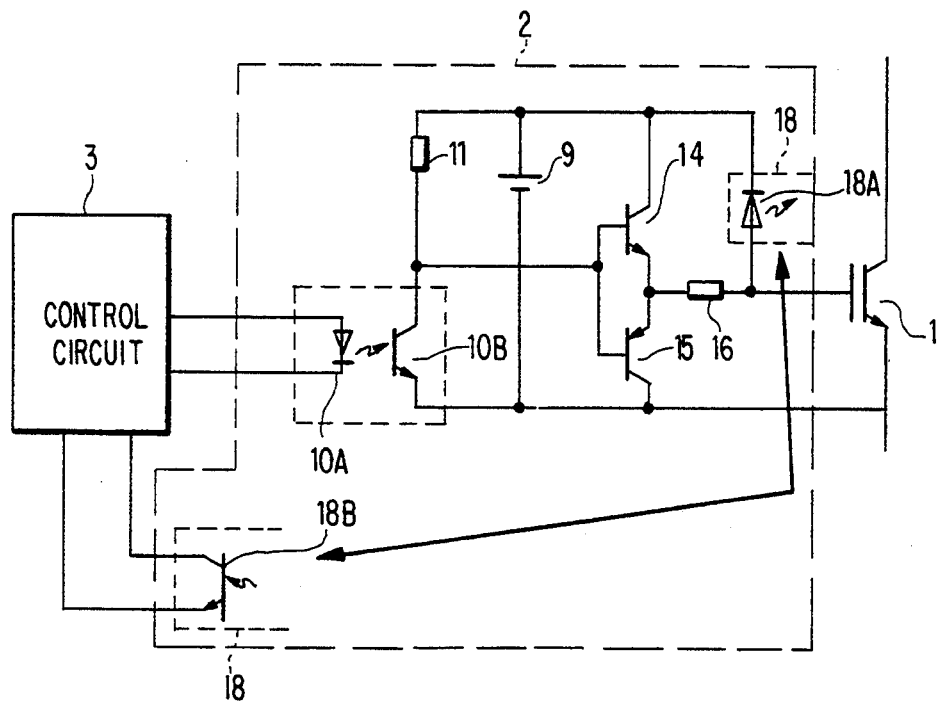
FIG. 1 is a circuit diagram of an overcurrent protector for a power element in accordance with a first embodiment the invention.

FIG. 1 illustrates a circuit serving as an overcurrent protector for a power element 1. In FIG. 1, a first photocoupler 10 is used for isolating and receiving a control signal from a control circuit 3. A second photocoupler 18 comprising an LED 18A as an input side thereof and a phototransistor 18B as an output side thereof, also is used. The LED 18A is connected between the gate of the power element 1 and the positive terminal of a gate driving DC power supply 9 in a direction designated in FIG. 1, and the phototransistor 18B is connected to the control circuit 3.

The operation of the circuit will now be described. With the second photocoupler 18 connected as shown in FIG. 1, the LED 18A, acting as the input side, performs an equivalent operation to the diode 17 shown in FIG. 9, i.e. clamps the gate voltage $V_{GE}$ of the power element 1 attributable to an overcurrent in the main circuit, e.g. a short circuit, to limit the rise of that gate voltage. The phototransistor 18B, acting as the output side, is operative to output a detection signal representing the overcurrent. The signal is a current corresponding to the energizing current of the LED 18A that varies in accordance with the magnitude of the overcurrent. The control circuit 3 outputs a control signal to stop or limit the energization of the power element 1 when the detection signal is inserted.

The second photocoupler 18 is inserted and connected to a gate amplifier circuit 2, as described above, and is operative to suppress the rise of the gate voltage $V_{GE}$ of the power element 1 at the occurrence of a short circuit. As a result, the short circuit duration is made longer. Photocoupler 18 also can judge an input current flowing therein as an overcurrent (short circuit) and transmit its occurrence to the control circuit 3.

In other words, a single second photocoupler 18 can achieve three operations: the clamping of the gate voltage, the isolation of the main circuit and the control circuit, and the detection of an overcurrent.

A second embodiment of the invention will now be described in accordance with FIG. 2. The structure of a circuit in FIG. 2 is substantially identical to that of the circuit shown in FIG. 1. The two circuits are different only in that the phototransistor 18B as the output side of the second photocoupler 18 is inserted and connected between the control signal output side of the control circuit 3 and the LED 10A acting as the input side of the first photocoupler 10.

In FIG. 2, the first photocoupler 10 is employed to isolate the control circuit 3 from the main circuit. Whereas the input of the second photocoupler 18 is identical to that in the first embodiment, the output thereof is directly connected to the input of the first photocoupler 10 for isolation. As a result, the occurrence of an overcurrent can be detected and the input of the control signal can be immediately stopped to shut off the power element more easily.

Figure 3:
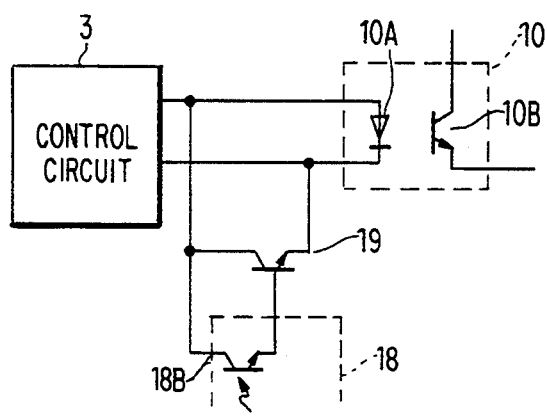

An example given in FIG. 3 shows that, in the circuit shown in FIG. 2, a transistor 19 is Darlington-connected to the phototransistor 18B at the output side of the second photocoupler 18 and the output side of the second photocoupler 18 is connected to the primary side of the first photocoupler 10 via the Darlington-connected transistor 19.

As described above, a current capacity can be increased by Darlington-connecting the transistor 19 to the output of the second photocoupler 18. The Darlington-connection allows a larger current to run without risk of failure.

A third embodiment of the invention will now be described in reference to FIG. 4. The structure of a circuit in FIG. 4 is substantially identical to those of the circuits shown in FIG. 1 and FIG. 2. They are only different in that the phototransistor 18B as the output side of the second photocoupler 18 is connected between the gate G and emitter E of the power element 1.

In this circuit, when the gate voltage $V_{GE}$ of the power element 1 rises at the occurrence of an overcurrent, the second photocoupler 18 is switched "ON" to reduce the voltage $V_{GE}$ across the gate and emitter of the power element 1, thereby switching "OFF" the power element.

FIG. 5 gives an example wherein the transistor 19 is Darlington-connected to the output of the second photocoupler 18, in a similar manner to the circuit shown in FIG. 3, to increase the current capacity, thereby producing a similar effect.

The IGBT employed as the power element in the above embodiments 1 to 3, by way of example, may be replaced by a power MOSFET, a bipolar transistor or the like to raise the gate or base voltage at the time of a short circuit in a similar manner, whereby a similar effect can be produced by any of the first to third embodiments.

Namely, according to the present invention, the power element 1 is switched "OFF" when the gate voltage rise of the power element 1, such as the IGBT, the power MOSFET or the bipolar transistor, at the time of an overcurrent occurrence is detected by the second photocoupler 18, and the gate voltage rise is suppressed by the LED 18A in the input side of the second photocoupler 18. Accordingly, since three operations of gate voltage clamping, isolation and overcurrent detection can be performed by only the single second photocoupler, an inexpensive, compact and low-loss overcurrent protection circuit can be achieved for the power element 1.

As described above, the first embodiment provides a relatively low-cost overcurrent protector for a power element which can raise the short-circuit capacity of said power element and detect a short circuit. According to the first embodiment, the second photocoupler has its input side inserted between the gate of the power element and the positive side of the gate driving DC power supply to limit the rise of the gate voltage of the power element caused by an overcurrent, and can output the detection signal of the overcurrent from its output side, and the detection signal is output to the control circuit which then outputs a control signal for stopping or limiting the energization of the power element.

The second and third embodiments provide a comparatively inexpensive overcurrent protector for a power element which enhances the overcurrent and short-circuit capacities of the power element. According to the second embodiment, the second photocoupler has its input side inserted between the gate of the power element and the positive side of the gate driving DC power supply to limit the rise of the gate voltage of the power element caused by an overcurrent, and can output the detection signal of the overcurrent from its output side, and the output side of the second photocoupler is inserted between the control circuit and the input side of the first photocoupler to control the input of the control signal from the control circuit to the first photocoupler so as to stop the energization of the power element. According to the third embodiment, the gate and emitter of the power element are connected at the time of overcurrent detection in the output side of the second photocoupler in the second embodiment to stop the energization of the power element.

What is claimed is:

1. An overcurrent protector for a power element, having a gate, emitter and collector and being connected in a circuit between a power supply and a load circuit, comprising:
    a control circuit for outputting a control signal for providing an ON/OFF control of said power element, and
    control signal amplifier means for receiving said control signal and supplying said control signal to the gate of said power element, said amplifier means being isolated from said control circuit and said power supply.

2. An overcurrent protector for a power element as set forth in claim 1 further comprising detecting means connected between the gate of said power element and said amplifier means for detecting an overcurrent in said amplifier means and for outputting a signal to the input of said control circuit which is operative to control operation thereof.

3. An overcurrent protector for said power element as set forth in claim 1 further comprising detecting means connected between the gate of said power element and said amplifier means for detecting an overcurrent in said amplifier means and for outputting a detection signal to change the output of said control circuit and limit the energization of said power element.

4. An overcurrent protector for said power element as set forth in claim 1 further comprising detecting means connected between the gate of said power element and said amplifier means for detecting an overcurrent in said amplifier means and for outputting a detection signal and output control means connected between said gate and emitter of said power element and responsive to said detection signal to control the output of said power element.

5. The overcurrent protector of claim 1 wherein said control signal amplifier means comprises a first photocoupler for performing said receiving and supplying of said control signal.

6. The overcurrent protector of claim 2 wherein said amplifier means further comprises a gate driving DC power supply, and said detecting means further comprises a photocoupler means having an input side and an output side, said input side being inserted between said power element gate and the positive side of said gate driving DC power supply for controlling the rise of the gate voltage of said power element due to an overcurrent, said photocoupler means being operative to output a detection signal of said overcurrent from said output side thereof to said control circuit so that said control circuit outputs a control signal which at least limits the energization of said power element.

7. The overcurrent protector of claim 3 wherein said amplifier means further comprises a gate driving DC power supply, an output control means for controlling the output of said control circuit, and said detecting means further comprises a photocoupler means having an input side and an output side, said input side being inserted between said power element gate and the positive side of said gate driving DC power supply for controlling the rise of the gate voltage of said power element due to an overcurrent, said photocoupler means being operative to output a detection signal of said overcurrent from said output side thereof to said output control means so that said control circuit control signal at least limits the energization of said power element.

8. The overcurrent protector of claim 4 wherein said amplifier means further comprises a gate driving DC power supply, and said detecting means further comprises a photocoupler means having an input side and an output side, said input side being inserted between said power element gate and the positive side of said gate driving DC power supply for controlling the rise of the gate voltage of said power element due to an overcurrent, said photocoupler means being operative to output a detection signal of said overcurrent from said output side thereof to said output control means so that said energization of said power element is limited.

9. The overcurrent protector of claim 5 wherein said amplifier means further comprising a gate driving DC power supply, and said protector further comprises a second photocoupler means having an input side and an output side, said input side being inserted between said power element gate and the positive side of said gate driving DC power supply for controlling the rise of the gate voltage of said power element due to an overcurrent, said second photocoupler means being operative to output a detection signal of said overcurrent from said output side thereof to at least limit the energization of said power element.

10. The overcurrent protector of claim 6 wherein said control signal amplifier means comprises a first photocoupler for performing said receiving and supplying of said control signal.

11. The overcurrent protector of claim 7 wherein said control signal amplifier means comprises a first photocoupler for performing said receiving and supplying of said control signal.

12. The overcurrent protector of claim 8 wherein said control signal amplifier means comprises a first photocoupler for performing said receiving and supplying of said control signal.

13. An overcurrent protector for a power element as set forth in claim 7 wherein said output control means comprises a Darlington-connected transistor at the output of said photocoupler means output side.

14. An overcurrent protector for a power element defined in claim 8 wherein said output control means comprises a Darlington-connected transistor at the output of said photocoupler means.

15. An overcurrent protector for a power element comprising: a control circuit for outputting a first control signal for carrying out the ON/OFF control of the power element inserted in a load circuit, control signal amplifier means for receiving said control signal, amplifying and supplying it to the gate of said power element, and a photocoupler having an input side thereof inserted between said power element gate and the positive side of a gate driving DC power supply in said control signal amplifier means for controlling the rise of the gate voltage of said power element due to an overcurrent and capable of outputting a detection signal of said overcurrent from an output side thereof, said photocoupler outputting said overcurrent detection signal to said control circuit so that said control circuit outputs a second control signal which stops or limits the energization of said power element.

16. An overcurrent protector for a power element comprising: control signal amplifier means receiving a control signal for carrying out the ON/OFF control of the power element inserted in a load circuit and amplifying and outputting it to the gate of said power element, and a photocoupler having an input side thereof inserted between said power element gate and the positive side of a gate driving DC power supply in said control signal amplifier means for controlling the rise of the voltage of said power element gate due to an overcurrent and capable of outputting a detection signal of said overcurrent from an output side thereof, said photocoupler having its output side inserted at the input side of said control signal amplifier for controlling the input to said control signal amplifier in accordance with said overcurrent detection signal to stop the energization of said power element.

17. An overcurrent protector for a power element defined in claim 5, wherein said photocoupler has its output side connected between the gate and emitter of said power element and connects said gate and emitter of the power element to stop the energization of said power element due to an overcurrent.

* * * * *